United States Patent [19]

Honda et al.

[11] Patent Number: 4,924,237
[45] Date of Patent: May 8, 1990

[54] ANTENNA AND ITS ELECTRONIC CIRCUIT COMBINATION

[75] Inventors: Kazuhiro Honda; Kouji Yamashita; Masanori Kawai; Kazuo Nakahi; Kuniharu Tatetsuki, all of Osaka, Japan

[73] Assignee: Matsushita Electric Works, Ltd., Osaka, Japan

[21] Appl. No.: 243,744

[22] Filed: Sep. 13, 1988

[30] Foreign Application Priority Data

Mar. 28, 1988 [JP] Japan .................................. 63-73684

[51] Int. Cl.$^5$ .............................................. H01Q 1/24
[52] U.S. Cl. .................................... 343/702; 343/750; 343/848
[58] Field of Search ................ 343/700 MS, 702, 725, 343/750, 751, 820, 822, 848, 849, 861, 855; 455/89, 90

[56] References Cited

U.S. PATENT DOCUMENTS

| | | | |
|---|---|---|---|
| 4,410,891 | 10/1983 | Schaubert et al. | 343/700 MS |
| 4,554,549 | 11/1985 | Fassett et al. | 343/700 MS |
| 4,721,962 | 1/1988 | Gorzel | 343/702 |
| 4,804,965 | 2/1989 | Roederer | 343/700 MS |

FOREIGN PATENT DOCUMENTS

| | | |
|---|---|---|
| 0246026 | 11/1987 | European Pat. Off. . |
| 0272145 | 6/1988 | European Pat. Off. . |
| 0039842 | 4/1978 | Japan .................................. 343/702 |
| 0007204 | 1/1985 | Japan .................................. 343/702 |
| 1457173 | 12/1976 | United Kingdom . |
| 2187333 A | 9/1987 | United Kingdom . |
| 2194101 A | 2/1988 | United Kingdom . |

Primary Examiner—Rolf Hille
Assistant Examiner—Doris J. Johnson
Attorney, Agent, or Firm—Armstrong, Nikaido, Marmelstein, Kubovcik & Murray

[57] ABSTRACT

An antenna and its electronic circuit combination is presented to comprise a ground conductor plane 30, a radiating conductor plane 40 disposed in parallel spaced relation to the ground plane 30 and shorted at its one end to the ground plane 30. A ground plane 30 is preferably formed on a printed board 10 which is disposed in parallel relation to the radiating plane 40 to define therebetween an open air space. Mounted on the printed board 10 and received within the open air space are electronic components which form a receiving or transmitting electronic circuit 60 associated with the antenna structure and electrically coupled by means of a feed element 20 to a feed point 44 on the radiating plane 40. Consequently, a number of electronic components forming the electronic circuit for the antenna can well be incorporated within the antenna structure by better utilization of the open air space formed between the radiating and ground planes, giving a space saving compact arrangement to the antenna and its electronic combination suitable for installation in a limited space.

20 Claims, 14 Drawing Sheets

Distance between antenna and sample conductor ($\lambda$)

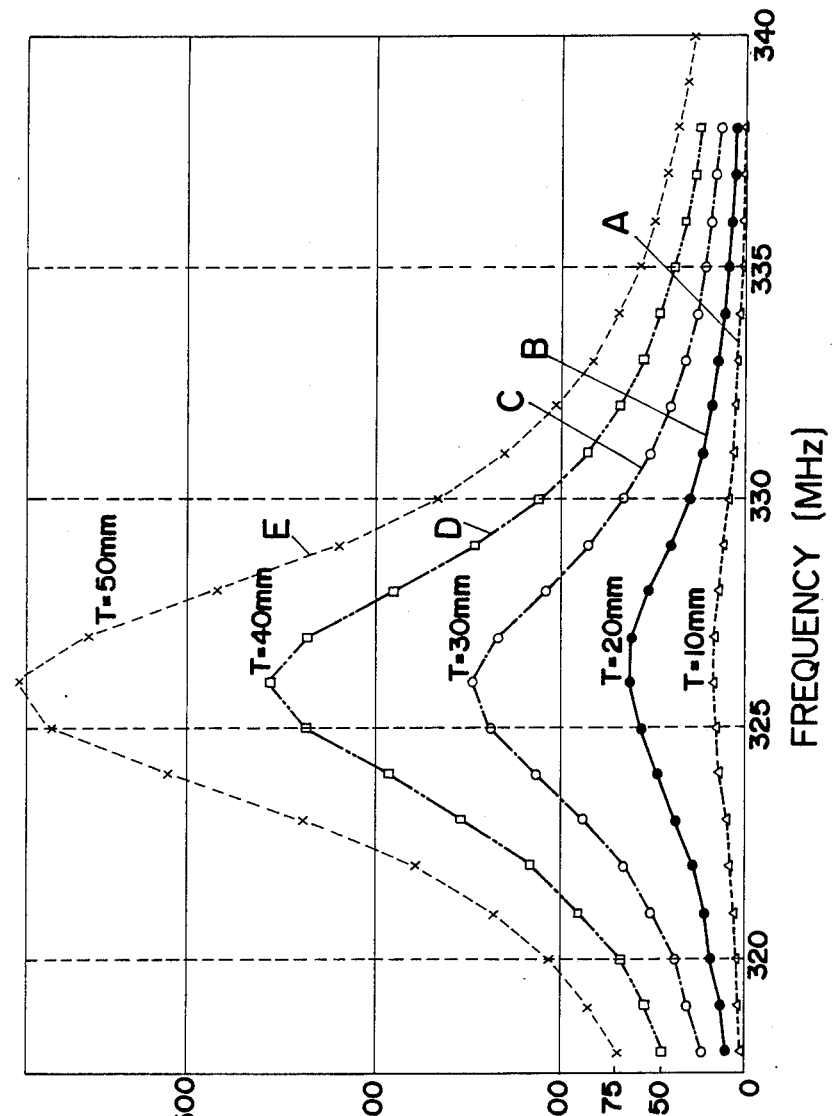

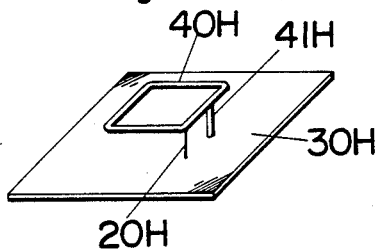
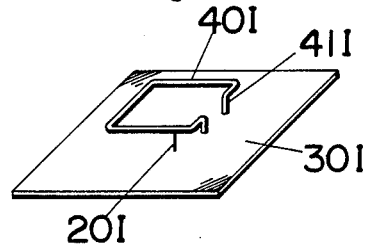
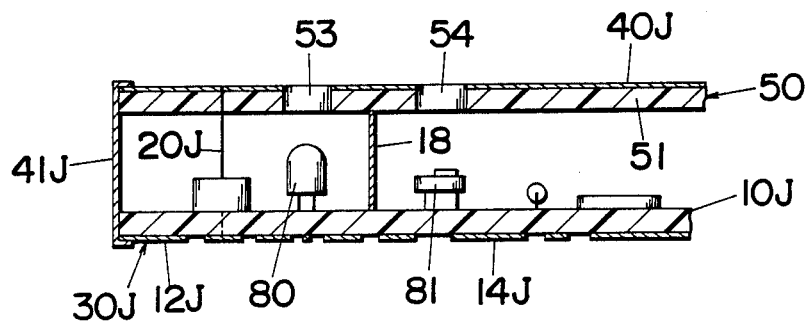
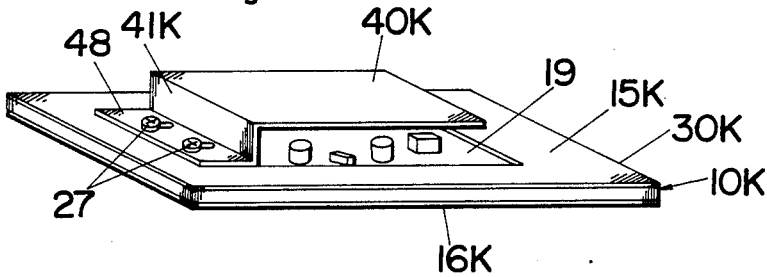
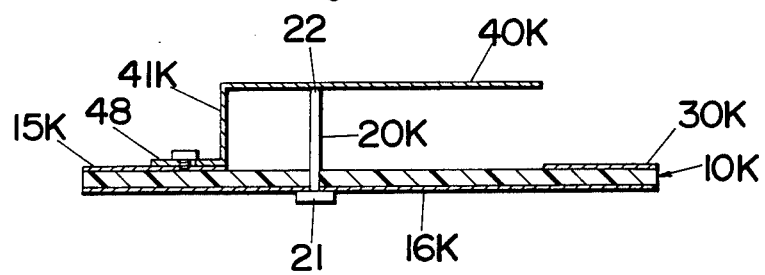

ANTENNA AND ITS ELECTRONIC CIRCUIT COMBINATION

BACKGROUND OF THE INVENTION

1. Field of the Invention

The present invention is directed to an antenna and its electronic circuit combination, and more particularly, to an antenna having a radiating plane arranged in parallel with a ground plane and incorporating its associated electronic circuit in a space saving manner.

2. Description of the Prior Art Due to a wide spread use of radio receiving and transmitting devices in a building or home for surveillance and paging systems, there have been a growing demand to provide a small and compact radio receiving or transmitting device including a particular antenna with its associated electronic circuit for easy installation in a limited space. To this end, there have been proposed a small antenna, for example, as disclosed in U.S. Pat. Nos. 4,700,194 and 4,701,763. The prior antenna comprises a radiating plane and a ground plane which are formed on the opposite faces of a dielectric substrate in parallel relation to one another and shorted between the corresponding ends thereof. Although such antenna structure is found to be advantageous in reducing the size of the antenna, it is not satisfactory to reduce the total size or the bulk of the antenna plus its electronic circuit combination. In fact, the prior antenna is designed to be electrically coupled to an external receiving or transmitting circuit by means of a coaxial transmission line extending from the undersurface of the ground plane opposite of the radiating plane and is not intended to incorporate electronic components for the electronic circuit. Further, because of the substrate which occupies the space between the radiating and ground planes, it is not possible to incorporate such electronic components between these planes. Consequently, the prior antenna is found not suitable and sufficient for reducing the size of the antenna and its electronic circuit combination.

SUMMARY OF THE INVENTION

In view of the above problem, the present invention has been accomplished to provide an antenna and its electronic circuit combination of space saving structure. The combination antenna comprises a ground conductor plane, a radiating conductor plane disposed in parallel spaced relation to the ground plane to define therebetween an open air space and shorted at its one end to the ground plane. A receiving or transmitting electronic circuit is formed on the ground plane and coupled by means of a feed element to a feedpoint on the radiating plane. The electronic circuit comprises a number of electronic components which are disposed within the open air space between the ground and radiating planes. Thus, the electronic components forming the electronic circuit for the antenna can be incorporated within the antenna structure by better utilization of the open air space formed between the radiating and ground plane and without requiring any additional space outside of the radiating or ground plane.

Accordingly, it is a primary object of the present invention to provide an antenna and its electronic circuit combination which requires substantially no extra space other than the antenna structure for incorporation of the electronic components and therefore can be made compact as the combination assembly of the antenna and its electronic circuit.

In a preferred embodiment, a printed board is utilized which comprises a conductor layer on a substrate mounting the electronic components. The conductor layer is etched to provide a conductor loop extending around the periphery of the printed board to define the ground plane and is also etched to provide inside of the conductor loop wiring pattern or patterns for electrical interconnection of electronic components. With this provision of the ground plane and wiring patterns in a coplanar relation, it is easy to utilize the ground plane as a common ground plane for the electronic circuit on the wiring patterns, which is therefore another object of the present invention.

The radiating plane is identical in width but shorter in length than the ground plane and is shorted at its lengthwise end to the ground plane for obtaining an antenna structure of substantially non-directional radiation pattern. This non-directional antenna can be found particularly useful when the antenna is installed in a wall surface of a room which is required to cover outside as well as inside of the room for radio communication with the outside as well as inside of the room.

In a preferred embodiment, the radiating plane is defined by a ring frame having a center opening through which substantially all of the electronic components are exposed. This contributes to minimizing internal electric field disturbance which would be otherwise developed by the presence of the electronic components between the radiating plane and the corresponding portion of the ground plate and which would cause energy loss or antenna gain reduction. Thus, by eliminating the center conductive portion of the radiating plate, the electronic components can be successfully disposed on the ground plane while being prevented from causing undesirable energy loss or antenna gain reduction, yet assuring a desired antenna performance at the outer periphery of the radiating plane and the corresponding edge of the ground plane, which is therefore a still further object of the present invention. The ring shaped radiating element may be composed at least partially of a wire or the like thin element.

In a particular embodiment of the present invention, the ring-shaped radiating element is shorted by a first short element to the ground plane and cooperative therewith and the specific ones of the electronic components to present a receiving antenna. The center opening of the ring-shaped radiating element is best utilized to accommodate therein another radiating element which is shorted by a second short element to the common ground plane and cooperative with the other specific electronic components to present a transmitting antenna. Thus, a composite antenna device having the transmitting and receiving capabilities can be arranged within a space normally required for a single antenna structure.

It is therefore a still further object of the present invention to provide an antenna and its electronic circuit combination which has receiving and transmitting capabilities within a space of single antenna structure.

The ground plane may be provided in the form of a first conductor layer on an electrically insulative substrate of a printed board. The printed board includes a second conductor layer which is etched to present a wiring pattern or patterns for the electronic components. The first and second conductor layers may be on the same or opposite surfaces of the substrate depending upon specific application or design requirements.

It is therefore a still further object of the present invention to provide an antenna and its electronic circuit combination in which the ground plane is made as by a printed circuit technique.

In the present invention, there is further disclosed a unique and useful configuration effective for matching between the antenna impedance and the circuit impedance. To this end, a radiating plate defining the radiating plane is formed with a shorting element and is movably supported on the ground plane so as to vary the distance between the feedpoint on the radiating plate and the shorting element for matching adjustment of the impedance between the antenna and the electronic circuit. Consequently, the antenna impedance can be easily and exactly matched to the circuit impedance over a relatively wide range of circuit impedance without requiring the impedance adjustment on the side of the electronic circuit, giving rise to a greater degree of design flexibility of the electronic circuit.

It is therefore a further object of the present invention to provide an antenna and its electronic circuit combination in which the antenna impedance can be readily adjusted to match the circuit impedance.

For reliable adjustment of the impedance matching, the feed element is formed with a rounded tip for point contact with the radiating plate for exactly defining the feedpoint on the radiating plate. The feed element is also threadedly supported on the side of the ground plane to make the rounded tip movable away and towards the radiating plate, facilitating the adjustment of the feed element to the radiating plate.

It is therefore a further object of the present invention to provide an antenna and its electronic circuit combination in which the impedance matching can be made reliably and easily.

Also included in the electronic circuit is a level indicator for indicating the condition of the impedance matching between the antenna impedance and the electronic circuit impedance. Thus, an exact matching point can be confirmed by reference to the level indicator, which is therefore a further object of the present invention. Preferably, the radiating plate is formed with a window through which the level indicator can be viewed for an easy reference purpose.

On the side of the ground plane there is provided with an I/O terminal through which the electronic circuit is wired to an external device. The I/O terminal is located at portion not covered by the radiating plane so that the I/O terminal which inherently includes conductive parts will not act to substantially distort the electric field between radiating plane and the ground plane, preventing the I/O terminal from badly influencing upon the desired antenna characteristics. It is therefore a still further object of the present invention to provide an antenna and its electronic circuit combination in which an I/O terminal for connection of the electronic circuit with an external device is properly positioned on the side of the ground plane without causing any substantial interference to the antenna characteristics.

In addition to the above features, the present invention further discloses unique and useful antenna structures which are easily controlled to obtain improved radiating antenna characteristics, for example, with respect to the antenna impedance and directivity.

These and still other objects and advantages of the present invention will become more apparent from the following description of the preferred embodiments when taken in conjunction with the attached drawings.

BRIEF DESCRIPTION OF THE DRAWINGS

FIGS. 8 to 13 are partial perspective view respectively showing other modifications of the above first embodiment;

FIG. 14 is a sectional view showing still other modification of the above first embodiment;

FIG. 15 is a schematic perspective view of an antenna and its electronic circuit combination in accordance with a second preferred embodiment of the present invention;

FIG. 17 is a sectional view of the antenna combination of FIG. 15;

FIG. 18 is a graph showing an antenna impedance varying with the differing distance between the shorted point of a radiator to a ground plate and a feed point on the radiating plate over a particular frequency range;

DESCRIPTION OF THE PREFERRED EMBODIMENTS

<First embodiment>

Figure 1:
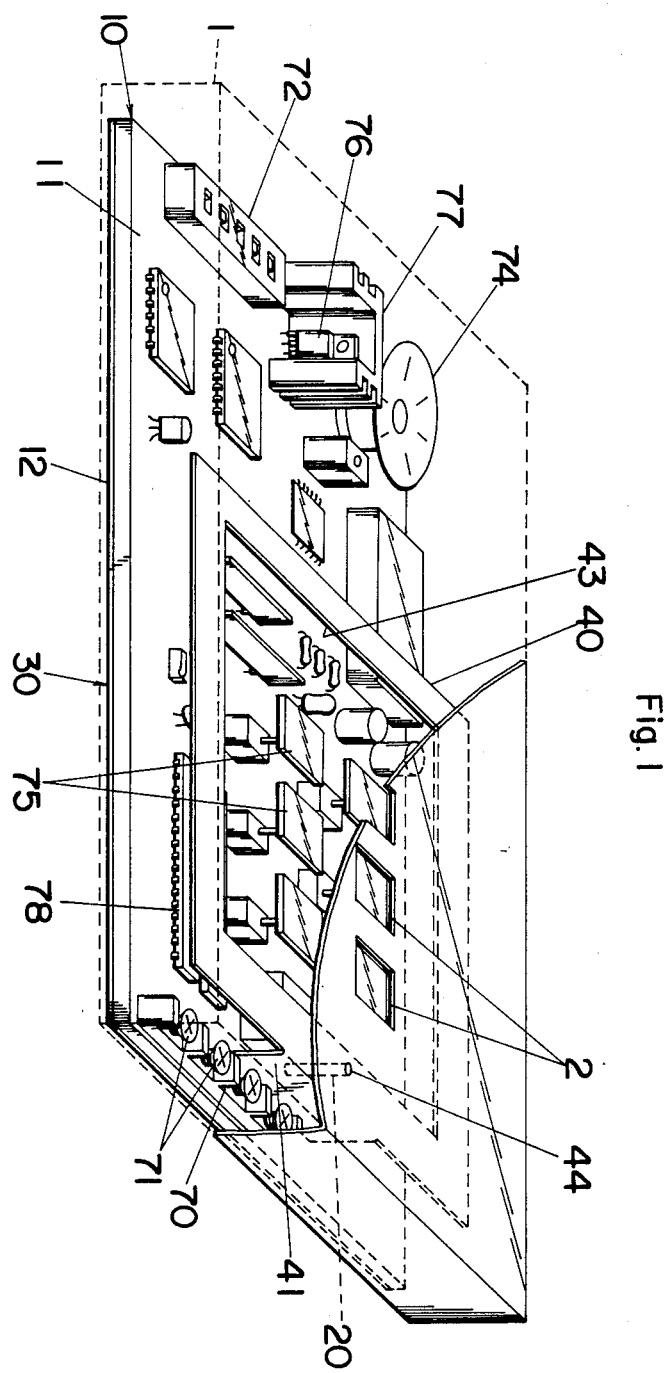
FIG. 1 is a perspective view of an antenna and its electronic circuit combination in accordance with a first preferred embodiment of the present invention.

Referring to FIG. 1, there is illustrated an antenna and its electronic circuit combination in accordance with a first embodiment of the present invention. The combination antenna comprises a rectangular printed board 10 having thereon a ground plane 30, a rectangular conductor radiating plate 40 arranged in parallel relation to the ground plane 30, and a number of electronic components mounted on the printed board 10 to form an associated electronic circuit 60. The radiating plate 40 is in the form of a ring-shaped plate with an integral shorting element 41 which depends from one extreme end thereof to be electrically coupled to the end portion of the ground plane 30 as well as mechanically coupled to the printed board 10 so that the radiating plate 40 is spaced in parallel relation to the ground plane 30 to leave therebetween an open air space. It is within this space that some of the electronic components are accommodated for providing a flat pack configuration to the antenna and electronic circuit combination.

Figure 2:
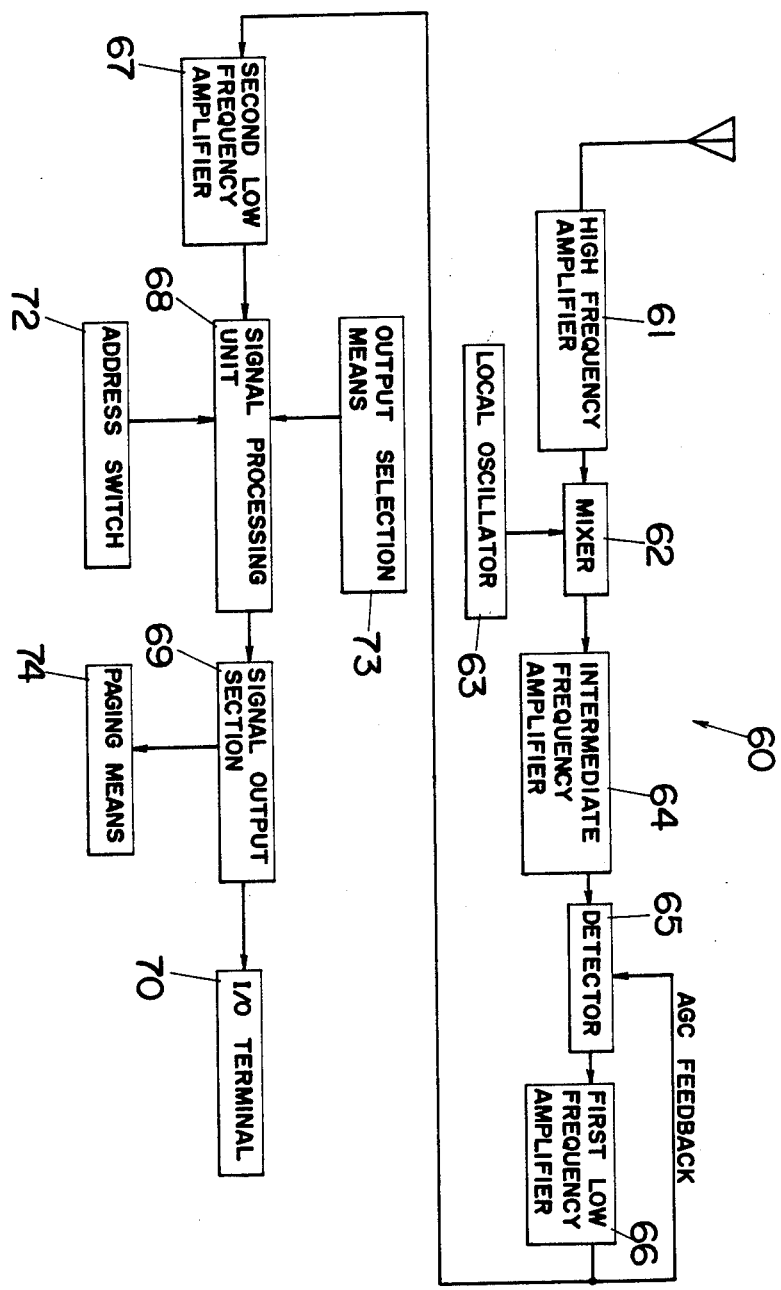
FIG. 2 is a block diagram of the above electronic circuit.

The antenna combination of FIG. 1 is designed as a receiving device for a bandwidth of 300 to 400 MHz and is utilized for example in a surveillance system of a home or building in which a number of sensors, i.e., fire sensors transmit radio signals to the antenna combination where the individual radio signals are processed to obtain information of the locations being monitored and to provide corresponding outputs indicative of such information in order to call for proper actions by residents or by security service firms. As illustrated in FIG. 2, the electronic circuit 60 comprises a high frequency amplifier 61, mixer 62, local oscillator 63, intermediate frequency amplifier 64, detector 65, first low frequency amplifier 66, second low frequency amplifier 67, signal processing unit 68, signal output section 69, and I/O terminal 70. The I/O terminal 70 is for providing the output to the security service firm, for example, through a telephone line (not shown) and/or to an external device to be controlled by such output. Additionally, I/O terminal 70 includes a power terminal through which the circuit is energized by an electric source of power available in the home or building. Also included in the circuit is an address switch 72 for identification of the particular sensors, a mode selection means 73 for changing the modes of the output from the circuit 60, and a paging means or loudspeaker 74 for notifying particular conditions detected by any one of the sensors. The antenna combination are accommodated within a suitable casing 1 for installation. As seen in FIG. 1, a plurality of pushbutton switches 75 are mounted to be accessible through a center opening 43 of the radiating plate 40 and through respective windows 2 of the casing 1 to actuate the mode selection means 73 for mode selection. Also seen in FIG. 1 are a CPU chip 78 for the signal processing unit 68 and a voltage regulator 76 with a heat radiator 77. It is noted at this point that the center opening 43 can serve as an access opening for the installation operation of fixing the printed board to a supporting structure such as by screws or the like fasteners.

Figure 3:
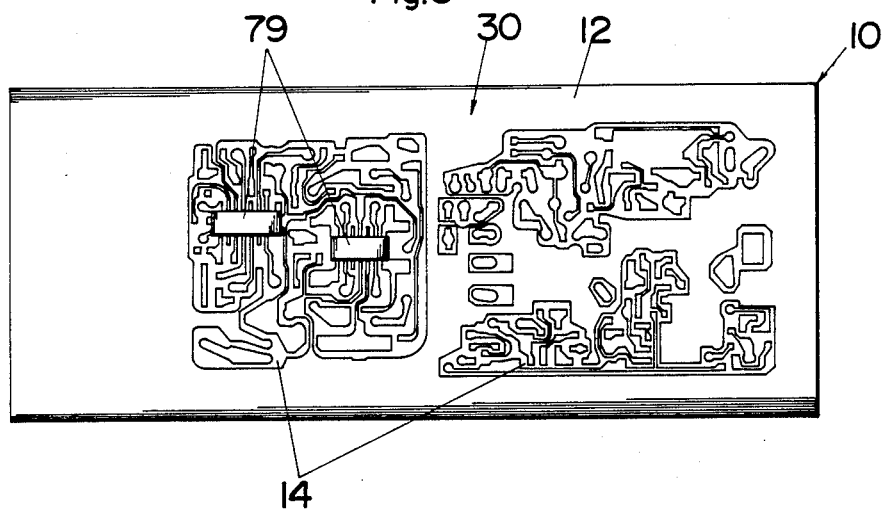
FIG. 3 is a bottom view of the antenna combination of FIG. 1.

The printed board 10 is provided on the undersurface of a substrate 11 with a copper layer which is etched to provide a conductor loop 12 extending around the periphery of the printed board 10 to define the ground plane 30, as shown in FIG. 3. Also, the center portion of the copper layer is etched to provide a wiring pattern or patterns 14 for interconnection of the electronic components. The conductor loop 12 defining the ground plane 30 may be cut at any portion without impairing the antenna characteristics. Most of the electronic components forming the electronic circuit 60 are mounted on the upper surface of the printed board 10 or the substrate 11 with the leads thereof extending through the substrate 11 for soldering connection with the wiring pattern 14. The remaining components 79 of flat configuration may be directly surface-mounted on the pattern 14, as seen in FIG. 3. The electronic circuit 60 is grounded to the conductor loop 12 at a suitable point or points. In this sense, the ground plane 30 serves commonly as the ground for the radiating plate 40 and the electronic circuit 60. A feed element 20 in the form of a single conductor wire extends from the printed board 10 to a feedpoint 44 on the radiating plate 40 adjacent the shorting element 41 with its lower end electrically coupled to the circuit 60 at a suitable point on the wiring pattern. It is noted at this point that the formation of the electronic circuit on the printed board 10 with the ground plane 30 can eliminate a coaxial transmission line generally required in the separated antenna and electronic circuit system. In the present embodiment, the printed board 10, or the ground plane 30 is dimensioned to have the identical width to but a greater length than the radiating plate 40 and is shorted to one lengthwise end of the radiating plate 40 in order that the antenna can have relatively non-directional radiation pattern.

Figure 4:
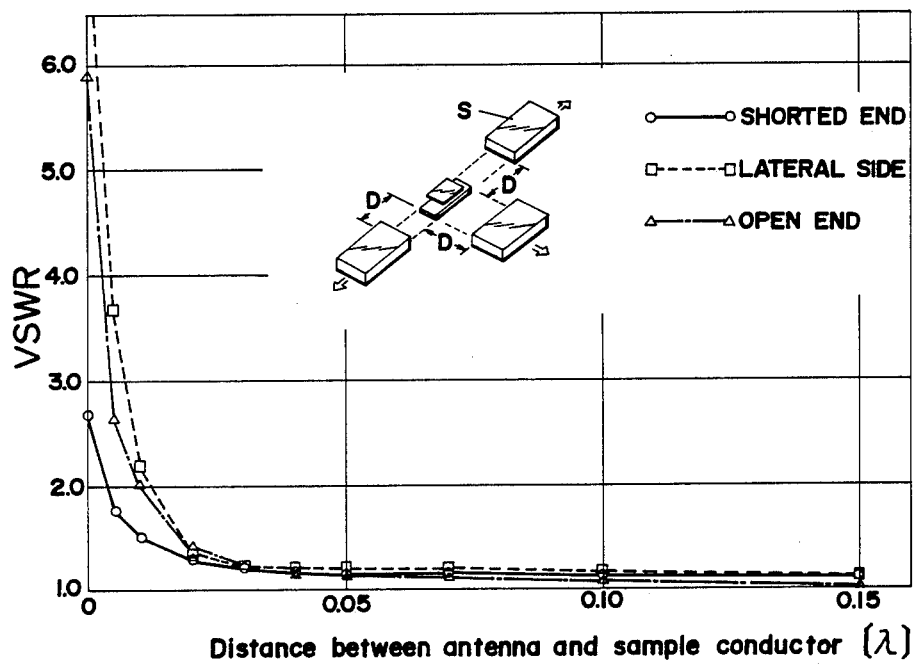
FIG. 4 is a graphical representation illustrating various curves of VSWR in relation to varying distance between an antenna structure and a nearby conductive material each disposed on closed end, open end, or lateral side of the antenna structure.

The I/O terminal 40 is mounted on the longitudinal end of the printed board 10 adjacent the shorting element 41 in an opposite relation from the feed element 20 in order to minimize the effect that the terminal 70 will disturb the electric field developed between the radiating plate 40 and the ground plane 30 or impair the antenna characteristics. This is critically important to the antenna combination of the present invention in which the I/O terminal 70 is mounted on the ground plane forming printed board 10 together with the electronic components forming the circuit 60, since the I/O terminal 70 carries wiring screws 71 and the signal transmission lines of conductive material which will certainly act to distort the electric field when located adjacent the radiating plate 40. FIG. 4 is presented to demonstrate that the above specific location of the terminal 70 carrying the conductors is advantageous in minimizing the undesired adverse effect. In FIG. 4, a sample conductor S of 0.27 $\lambda_0$ (L)×0.20 $\lambda_0$ (W)×0.07 $\lambda_0$ (H) as analogous to the terminal 70 was utilized for an antenna structure having a ground plane of 0.24 $\lambda_0$ (L)×0.1 $\lambda_0$ (W) and a radiating plate of 0.2 $\lambda_0$ (L)×0.1 $\lambda_0$ (W) spaced by a distance of 0.02 $\lambda_0$ to one another, in which $\lambda_0$ is a wavelength of an radio wave of 300 MHz in vacuum. The VSWR (voltage standing wave ratio) was plotted in relation to varying distance D between the sample conductor and the antenna structure for each of three different location modes of the sample conductor with respect to the antenna structure. The plotted curve of VSWR indicated by square dots was obtained for the conductor located outwardly of the lateral side of the antenna structure. Likewise, the VSWR curves respectively indicated by triangle and round dots were obtained for the conductor respectively located outwardly of the open longitudinal end and the other shorted or closed longitudinal end of the antenna structure.

As seen from FIG. 4, it is confirmed that the conductor located outwardly of the shorted end of the antenna will see less variation of VSWR with the varying distance D ($\lambda_0$) and therefore will exhibit less influence upon the antenna characteristics. Accordingly, the above specific location of the I/O terminal 70 carrying the conductor materials is advantageous in retaining the antenna characteristic stable for assuring an reliable antenna operations relatively free from reduced actual gain.

In addition, the provision of the ring-shaped radiating plate 40 is advantageous in preventing the antenna characteristics from being badly influenced by the electronic components mounted on the printed board 10. This is based from the finding that, when the electronic components are in juxtaposed relation to a radiating plate as in the case if a solid radiating plate without an opening extends over the electronic components, the electronic components on the printed board will distort the internal electric field and eventually bring about irregular electric field developed at the outer periphery of the radiating plate and accordingly impair the antenna characteristics. In this sense, the center portion of the radiating portion 40 is cutout to leave thereat the center opening 43 and the electronic components are mounted below the opening 43 in such a manner as to produce no substantial electric field to be distorted by the electronic components, assuring to develop at the outer periphery of the radiating plate 40 a regular and constant electric field and retaining stable antenna characteristics while permitting the electronic component to be well accommodated between the radiating plate 40 and the ground plane 30.

Figure 5:
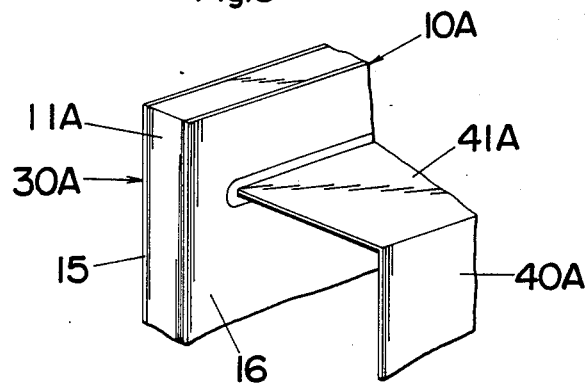
FIGS. 5 to 7 are partial perspective view respectively showing various modifications of the above first embodiment.
Figure 6:
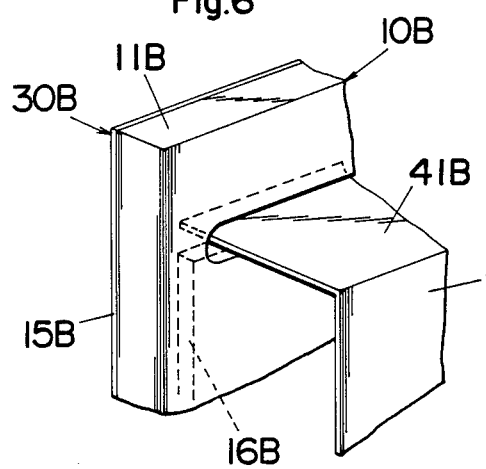
Figure 7:
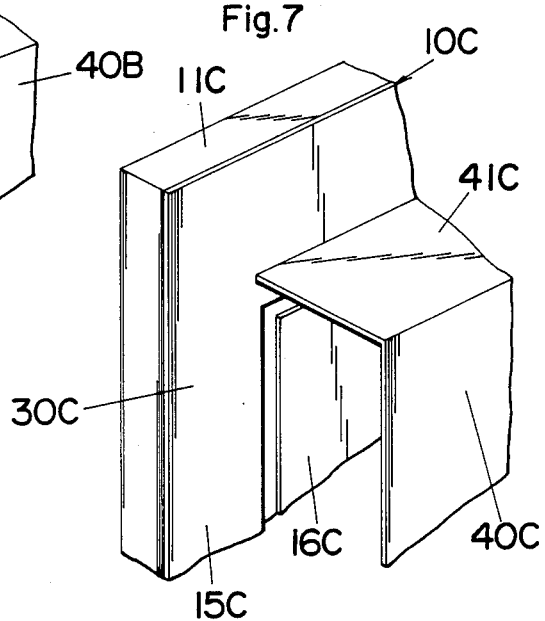
Figure 8:
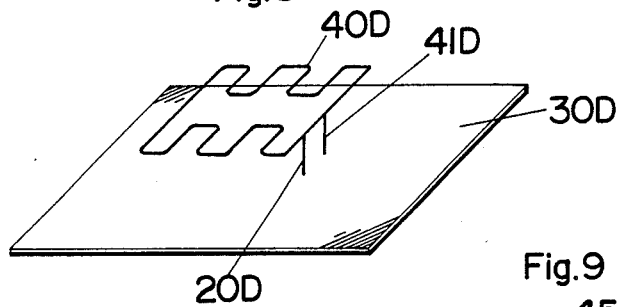

Although, in the above embodiment, a single conductor layer on the underside of the printed board 10 is utilized commonly as forming the ground plane 30 and the wiring pattern 14 for the electronic components, the present invention is not limited to this embodiment and may comprise a printed board with separate conductor layers each for the ground plane and the wiring pattern or patterns of the electronic components as shown in FIGS. 5 to 7, which are modifications of the above first embodiment and in which parts are designated by like numerals with suffix letters A, B, and C.

The modification of FIG. 5 utilizes a printed board 10A with first and second conductor layers 15 and 16 are formed on the opposite faces on a substrate 11A. The first conductor layer 15 defining a ground plane 30A is formed on the surface away from a radiating plate 40A, while the second conductor layer 16 is on the opposite surface is etched to provide a wiring pattern or patterns for the electronic components. The modification of FIG. 6 utilizes a printed board 10B with a first conductor layer 15B for a ground plane 30B on the surface of a substrate 11B away from a radiating plate 40B and with a second conductor layer 16B molded in the opposite surface thereof for wiring of the electronic components to be mounted on the same surface. The modification of FIG. 7 utilizes a printed board 10C with first and second layers 15C and 16C on the same surface of a substrate 11C adjacent a radiating plate 40C. The first layer 15C defining the ground plane 30C is in the form of a loop conductor extending around the periphery of the printed board 10C, while the second layer 16C for surface mounting of the electronic components are formed inwardly of the first conductor layer 15C.

Further, the ground plane may be provided in the form of a single conductor plate of enough thickness or rigidity for directly supporting the radiating plate. In such modification, the conductor plate has thereon an electrically insulative film or the like material for mounting the electronic components which are interconnected through a suitable wiring pattern or patterns formed on such film and are grounded to the ground plane forming conductor plate.

Figure 9:
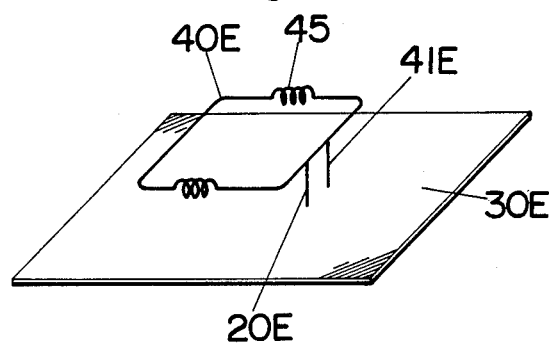
Figure 10:
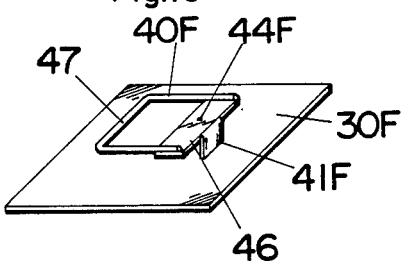
Figure 11:
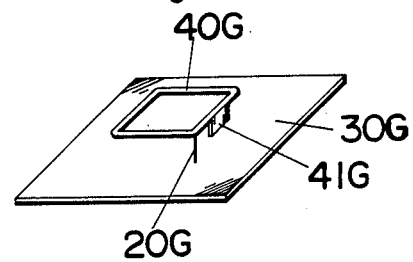
Figure 16:
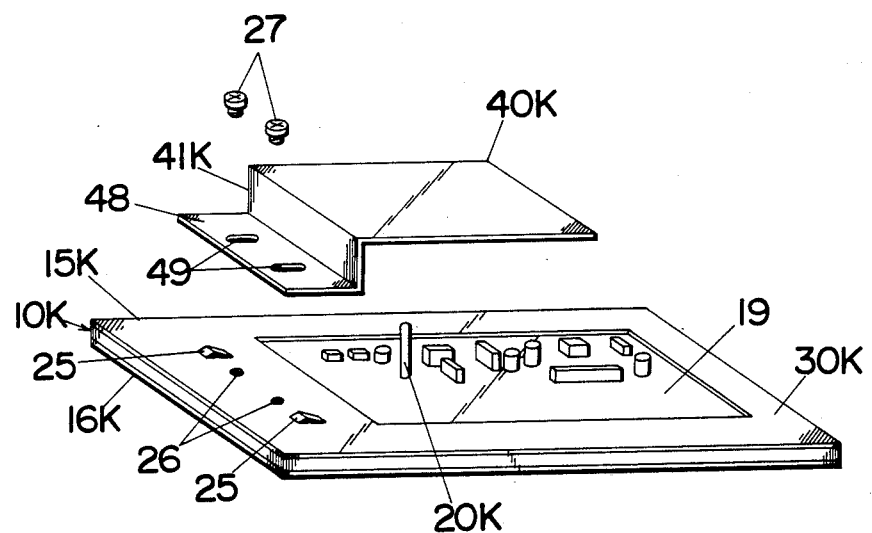
FIG. 16 is an exploded perspective view of the antenna combination of FIG. 15.

FIGS. 8 to 13 illustrates other modifications of the above embodiment in which a radiating plane is formed partially or entirely by a wire element with or without loading coils 45 (FIG. 9). In these modifications, like parts are designated by like numerals with suffix letters of D to I. In the modification of FIG. 10, a strip 46 having a feedpoint 44F thereon is combined with a U-shaped wire segment 47 to form a ring-shaped radiator 40F.

FIG. 14 illustrates a still further modification of the above first embodiment of which electronic circuit additionally includes a photosensor composed of a light emitting diode 80 and a photodiode 81 which are mounted on a printed board 10J with a partition 18 separating the diodes 80 and 81. In this modification, another printed board 50 is utilized to define a radiator plane 40J on the upper surface of a substrate 51. The printed board 50 is provided with emission and entrance ports 53 and 54 respectively for transmitting light from the LED 80 and passing the light reflected upon a target to the photodiode 81. In this manner, the electronic circuit on the printed board 10J may be utilized to include an additional function for the antenna combination. It is also to be noted that the electronic circuit may includes a transmitting capability in addition to the receiving circuit of FIG. 2 so that a single antenna structure can be utilized as receiving and transmitting antenna device simply by switching the receiving and transmitting functions such as by a time-sharing technique.

<Second embodiment>

Referring to FIG. 15, an antenna and its electronic circuit combination in accordance with a second embodiment is illustrated to have a radiating plate 40K movable relative to a ground plane 30K. A double-clad printed board 10K is utilized to define the ground plane 30K as well as to support the electronic components. An upper conductor layer 15K of the printed board 10K is etched to present the ground plane 30K extending around the periphery of the printed board 10K and leave inside thereof an insulative mounting section 19 for the electronic components. A lower conductor layer 16K is etched to present a wiring pattern or patterns to which the electronic components are soldered with their respective leads extending through the printed board 10K. A feed element 20K in the form of a threaded stud extends vertically through the mounting section 19 with its lower head 21 in electrical contact with the electronic circuit in the lower surface the printed board 10K and with its rounded tip 22 engageable in point contact with the radiating plate 40K. The feed element 20K is threadedly supported by the printed board 10K to be vertically movable for making its rounded tip 22 towards and away from the radiating plate 40K.

The radiating plate 40K is integrally formed at the lower end of the shorting element 41K with a horizontally extending slider 48 which is in slidable engagement with the upper conductor layer defining the ground plane 30K to make the radiating plate 40K movable relative to the ground plane 30K in the lengthwise direction thereof. For assuring electrical connection between the radiating plate 40K and the ground plane 30K, contact springs 25 are mounted on the ground plane 30K to be in constant contact with the radiating plate 40K. The radiating plate 40K can be fixed relative to the ground plane or the printed board 10K by screws 27 extending through longitudinally extending holes 49 in the slider 48 and corresponding threaded holes 26 in the printed board 10K. With the provision of the movable radiating plate 40K, it is possible to vary the distance between the feed point and the shorting element 41K for obtaining maximum matching efficiency between the antenna impedance and the circuit impedance of the electronic circuit.

FIG. 18 shows several curves of antenna impedance ($\Omega$) with differing distance T between the shoring element and the feedpoint plotted in relation to an operating radio frequency band in which curve A with triangle dots is plotted for the distance T of 10 mm, curve B with sold circle dots for the distance T of 20 mm, curve C with blank circle dots for the distance T of 30 mm, curve D with rectangular dots for the distance T of 40 mm, and curve E with cross dots for the distance T of 50 mm. As seen from the figure, a slight lag of the distance will cause a considerably large variation in the antenna impedance over the operating frequency band. Consequently, exact adjustment of such distance available in the antenna structure of this embodiment is found most advantageous in obtaining a desired antenna impedance, for example 50, 75 or 300 $\Omega$, while enabling an exact impedance matching between the antenna and the electronic circuit and assuring a maximum gain and sensitivity.

Figure 20:
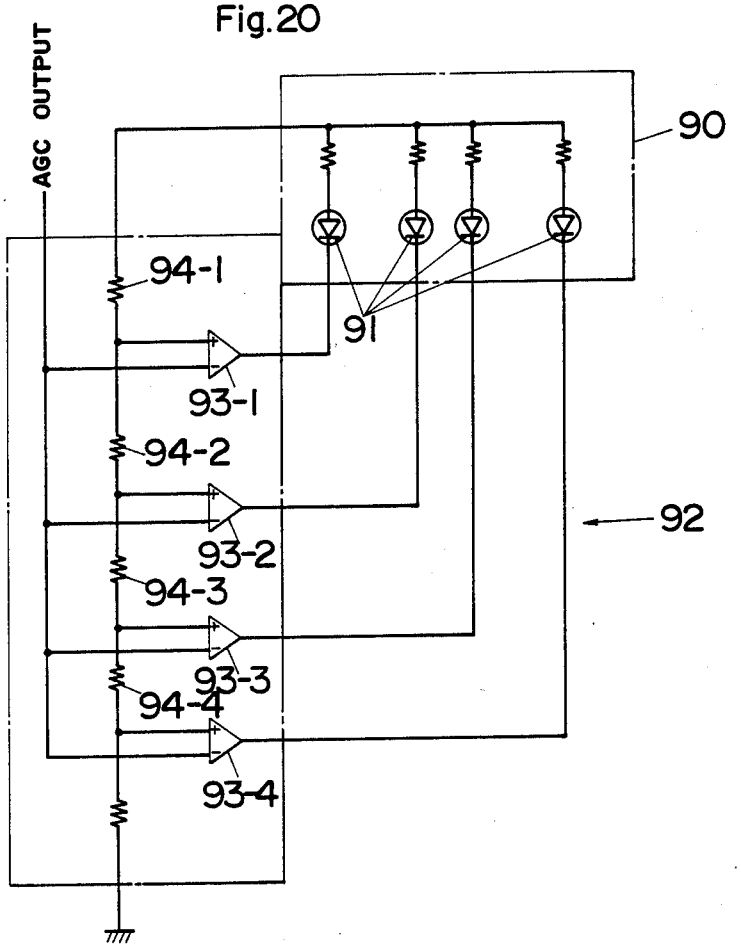
FIG. 20 is a circuit diagram for control of a level indicator utilized in the modification of FIG. 19.
Figure 19:
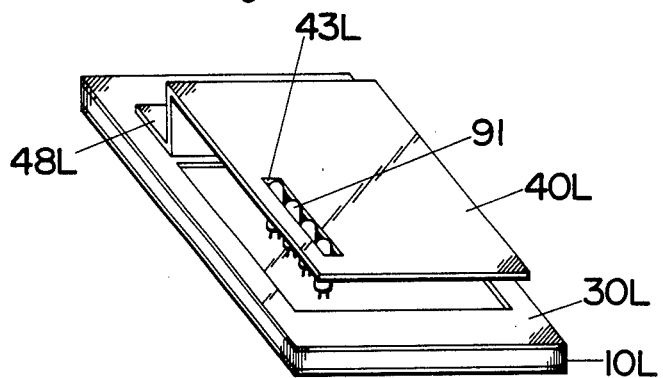
FIG. 19 is a perspective view of a modification of FIG. 15.

FIG. 19 illustrates a modification of the second embodiment which is similar to the second embodiment but further includes a level indicator 90 for impedance matching between the antenna and the electronic circuit. The level indicator 90, which is mounted on the printed board together with the electronic components and is viewed through a window 43L in a radiating plate 40L, comprising a number of light emitting diodes (LED) 91 arranged in a row and a driving circuit 92 thereof. As shown in FIG. 20, the driving circuit 92 comprises a plurality of comparators 93-1 to 93-4 and resistors 94-1 to 94-4 corresponding in number to the LED 91. The driving circuit 92 utilizes an automatic gain control (AGC) output, which is a feedback output from the first low frequency amplifier 66 to the detector 65 of the electronic circuit 60 of FIG. 2 and which exhibits an increasing level with an increasing voltage of the input radio frequency signal, in order to energize the individual LEDs 91. The comparators 93-1 to 93-4 are connected in circuit to receive the AGC output at their inverted inputs and to receive at the individual non-inverted input reference voltages of different levels from a dividing network of the resistors 94-1 to 94-4, and to provide a respective outputs the driving voltage to the corresponding LEDs 91. When it is received a higher AGC output indicative of a higher RF input or higher gain at the electronic circuit, the driving circuit 92 responds to energize a greater number of the LEDs 91 to turn on. Thus, it is confirmed by the level indicator 90 that a maximum gain or exact impedance matching between the antenna and the electronic circuit 60 is obtained when all of the LEDs 91 are turned on. With the aid of this level indicator 90, the radiating plate 40L can be readily adjusted its relative position to the ground plane 30L for obtaining an exact impedance matching or maximum gain of the antenna and its electronic combination.

<Third embodiment>

Figure 21:
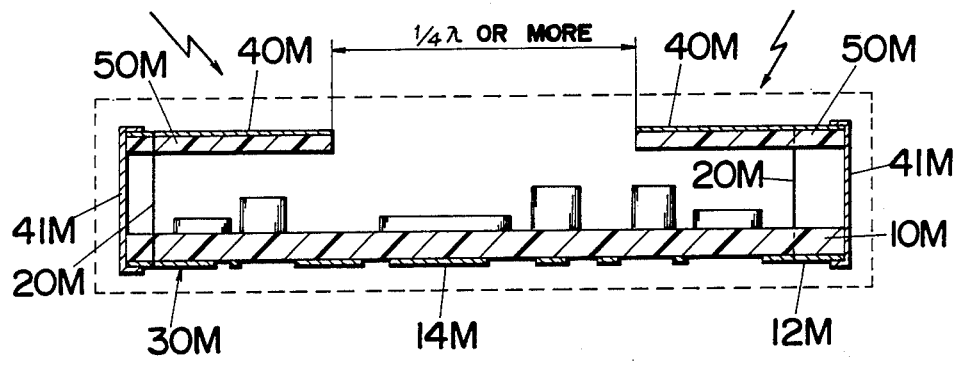
FIG. 21 is a sectional view of an antenna and its electronic circuit combination in accordance with a third embodiment of the present invention.

Referring to FIG. 21, a third embodiment of the present invention which is similar to the first embodiment of the present invention except that a pair of radiating plates 40M are provided in corporation with a single ground plane 30M on a printed board 10M for providing an antenna combination of space diversity system. The individual radiating plates 40M are spaced by a distance of not less than one-fourth wavelength $\frac{1}{4}\lambda$ at an operating frequency and are cooperative with the common ground plane 30M to provide a pair of receiving antennas of which outputs are suitably combined to provide a single receiving signal with reduced fading effects. For this purpose, the electronic circuit formed by the electronic circuit mounted on the printed board 10M includes, in addition to those shown in FIG. 2, control means by which the outputs of the individual receiving antennas are processed for obtaining the signal free from fading. In the same manner as in the first embodiment, a conductor layer on the lower surface of the printed board 10M is etched to form a peripheral conductor loop 12M defining the ground plane 30M as well as to form inside of the loop a wiring pattern or patterns 14M for connection of the electronic components mounted on the printed board 10M. Each of the radiating plates 40M, which is defined by a conductor layer on printed board 50M, is shorted at its end to the corresponding end of the ground plane 30M by means of shorting element 41M and is also connected to the suitable point of the wiring pattern by means of a feed element 20M.

<Fourth embodiment>

Figure 22:
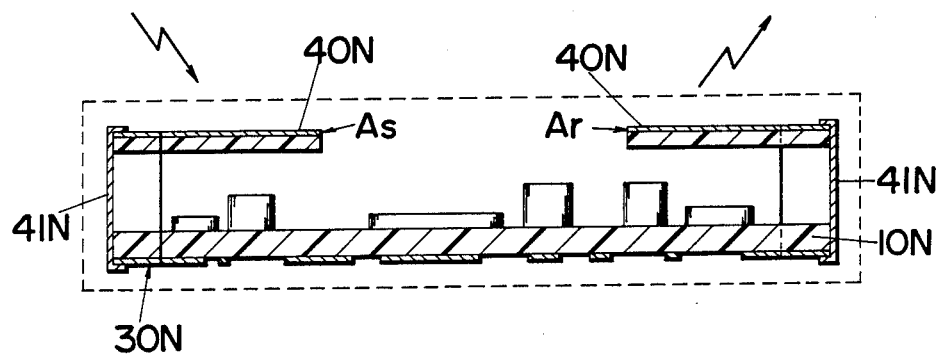
FIG. 22 is a sectional view of an antenna and its electronic circuit combination in accordance with a fourth embodiment of the present invention.

FIG. 22 illustrates a fourth embodiment of the present invention in which a pair of radiating plates 40N are cooperative with a single ground plane 30N on a printed board 10N to form a receiving antenna Ar and a transmitting antenna As. The structural arrangement of this embodiment are identical to that of the above third embodiment and therefore like parts designated by like numerals with a suffix letter N. However, electronic components mounted on the printed board 10N form, in addition to the receiving circuit of FIG. 2, a transmitting circuit (not shown).

Figure 23:
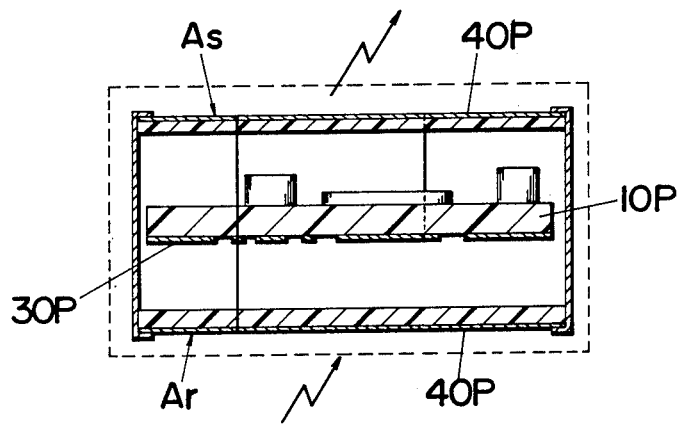
FIG. 23 is a sectional view of a modification antenna combination of FIG. 22.

FIG. 23 illustrates a modification of the fourth embodiment which comprises a pair of radiating plates 40P which are disposed on the opposite side of the printed board 10P to define a receiving antenna Ar and a transmitting antenna As above and below the printed board 10P mounting the electronic components forming associated receiving and transmitting electronic circuits.

Figure 24:
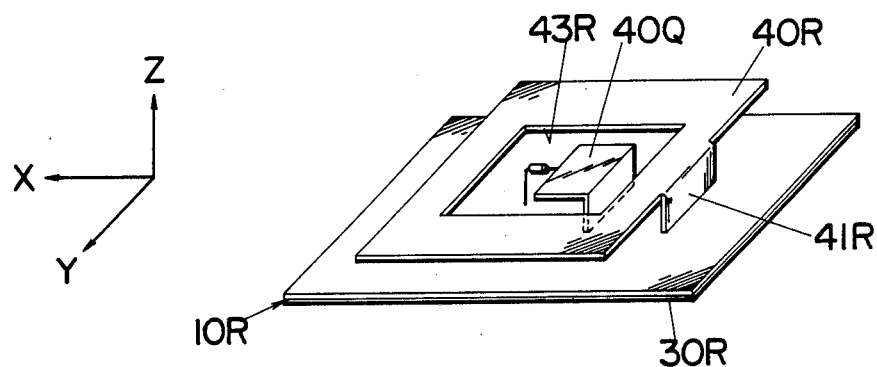
FIG. 24 is a schematic perspective view of an antenna and its electronic circuit combination in accordance with a fifth embodiment of the present invention.
Figure 25:
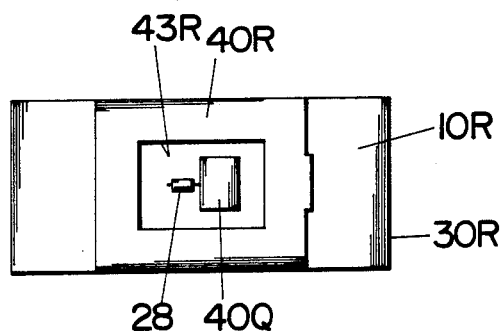
FIG. 25 is a top view of the antenna combination of FIG. 24.
Figure 26:
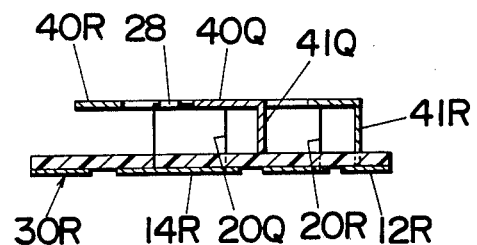
FIG. 26 is a sectional view of the antenna combination of FIG. 24.
Figure 27:
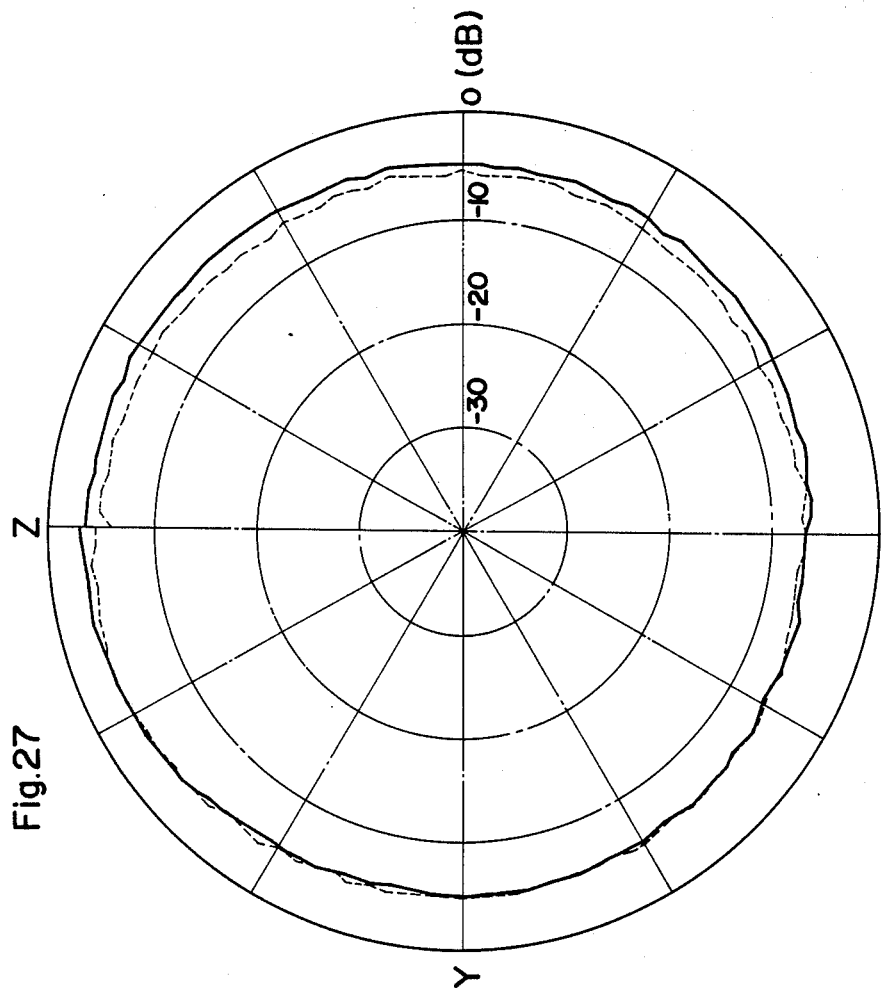
FIG. 27 shows radiation patterns for the Y-Z plane of the receiving antenna of FIG. 24 with and without a transmitting antenna.

FIGS. 24 to 26 illustrates another modification of the fourth embodiment which is characterized in that a first radiating plate 40Q defining a transmitting antenna As is received within the confines of a second radiating plate 40R defining a receiving antenna Ar. The second radiating plate 40R is in the form of a rectangular plate with a center opening 43R and is shorted at its one end by a shorting element 43R to a ground plane 30R formed on a printed board 10R. In the like manner as in the first embodiment, the printed board 10R has a lower conductor layer which is etched to form a peripheral conductor loop 12R defining the ground plane 30R and wiring patterns 14R inside of the conductor loop for electrical connection of the electronic components (not shown) which are mounted on the printed board to form receiving and transmitting electronic circuits respectively for the receiving and transmitting antennas Ar and As. The printed board 10R has a width equal to the radiating plate 40R but has a greater radiation pattern for the YZ plane, as indicted by a solid line in FIG. 27. The second radiating plate 40Q is in the form of a rectangular plate having considerably smaller width and length dimensions than the first radiating plate 40R and is shorted at its one end to the ground plane by mean of a second shorting element 41Q. A chip capacitor 28 is connected between the ground plane 30R and the end of the first radiating plate 40Q opposite to the shorting element 41Q for increasing an effective antenna length while keeping the physical size of the first radiating plate 40Q at a minimum to be well accommodated within the center opening 43R of the second radiating plate 40R and giving a desired antenna characteristics to the transmitting antenna As. The first and second radiating plates 40Q and 40R are connected respectively by first and second feed elements 20Q and 20R to the corresponding receiving and transmitting circuits at suitable points on the underside of the printed board 10R. The above disposition of the first radiating plate 40Q within the center opening 43R of the first radiating plate 43R is found particularly advantageous in that the incorporation of the transmitting antenna As induces no substantial loss in the gain of the receiving antenna Ar. This is confirmed from FIG. 27 in which the radiation patterns of the receiving antenna Ar with and without the transmitting antenna As for the YZ plane of the antenna structure of this embodiment are indicated respectively by solid and dotted lines.

<Fifth embodiment>

Figure 29:
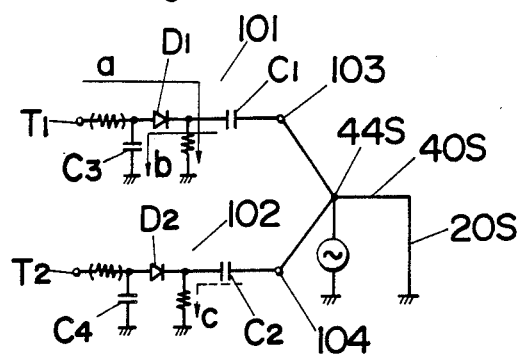
FIG. 29 is a circuit diagram of the antenna of FIG. 28.
Figure 28:
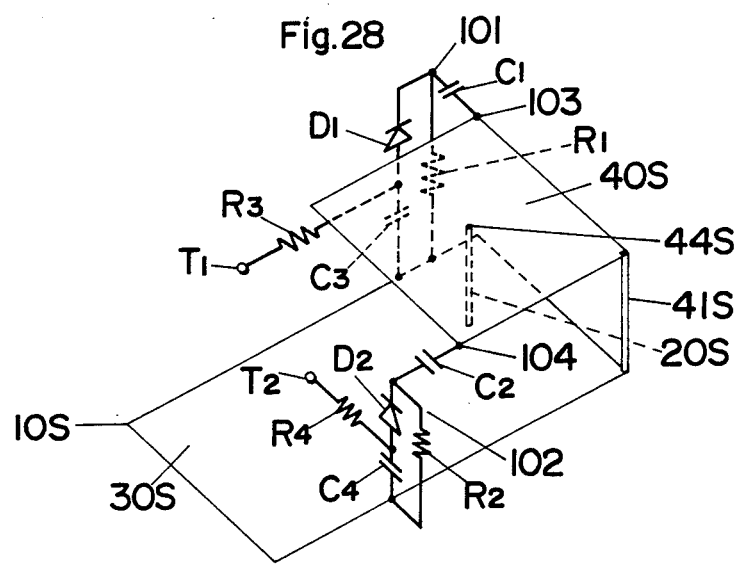
FIG. 28 is a schematic view showing a sixth embodiment of the present invention.

FIGS. 28 and 29 illustrates a fifth embodiment of the present invention which is effective for varying the antenna characteristics particularly with regard to the radiation pattern and the polarization. A rectangular radiating plate 40S is disposed in parallel relation to a ground plane 30S formed on a rectangular printed board 10S and shorted by a shorting element 41S in the form of a pillar extending between the corners of the radiating plate 40S and the ground plane 30S. Although not shown in the figures, the printed board 10S comprises a lower conductor layer which is etched likewise as in the first embodiment to provide a conductor loop defining the ground plane 30S and to provide inside thereof a wiring pattern or patterns for the electronic components which forms an associated electronic circuit. A feed element 20S extends vertically from a feedpoint 44S at the center of the radiating plate 40S to a suitable point at the electronic circuit. The radiating plate 40S is connected at its diagonally opposed corners 103 and 104 to the corresponding points on the ground plane 30S respectively through first and second loading circuits 101 and 102 of identical configuration.

As illustrated in the figures, each of the first and second loading circuits 101 and 102 comprises a reactance element in the form of a capacitor $C_1$, $C_2$ which is connected at its one end to the radiating plate 40S at $T_1$, $T_2$ and connected at the other end to the ground plane 30S through a diode $D_1$, $D_2$ and a bypass capacitor $C_3$, $C_4$. A bias resistor $R_1$, $R_2$ is inserted in each circuit with its one end connected to the connection between the diode $D_1$, $D_2$ and the capacitor $C_1$, $C_2$ and with the other end to the ground plane 30S. The connection between the diode $D_1$, $D_2$ and the bypass capacitor $C_3$, $C_4$ is connected through a resistor $R_3$, $R_4$ to a control terminal $T_1$, $T_2$. In operation when the control terminal $T_1$ receives a control signal of positive voltage, the diode $D_1$ becomes conductive to cause a forward current to flow through resistor $R_1$ to the ground plane 30S along a current path indicated by (a) in FIG. 29, permitting a high frequency signal to flow through capacitor $C_1$, diode $D_1$ and though bypass capacitor $C_3$ to the ground plane 30S along a path indicated by (b), thus loading the radiating plate 40S at 103 with the reactance element of capacitor $C_1$ to change the antenna characteristics. While on the other hand, when the control terminal $T_2$ receives a control signal of negative voltage, the diode $D_2$ is negative biased to remain nonconductive to thereby leave for a high frequency signal only a path as indicated by (c) and including capacitor $C_2$ and bias resistor $R_2$. However, because of high impedance (for example, more than several K$\Omega$) given to the bias resistor $R_2$, the high frequency signal is blocked by the resistor $R_2$ and therefore hardly flow to the ground through capacitor $C_2$, leaving the radiator plate 40S at 104 unloaded with the reactance element of capacitor $C_2$. In this manner, by suitably selecting to apply the control signal selectively or simultaneously to the first and second loading circuits, it is possible to change the antenna characteristics, while keeping the physical size of the radiating plate 40S to a minimum for easy installation of the antenna and its electronic circuit combination.

<Sixth embodiment>

Figure 31:
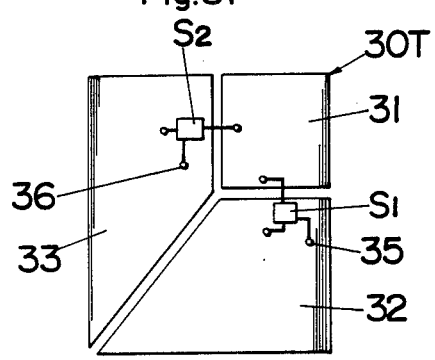
FIG. 31 is a schematic view of a ground plate utilized in the antenna of FIG. 30.
Figure 33:
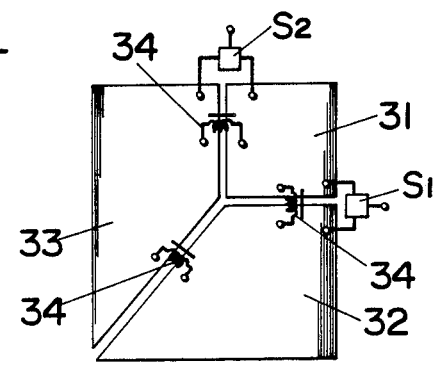
FIG. 33 is a schematic view of a ground plate of a modification of FIG. 31.
Figure 30:
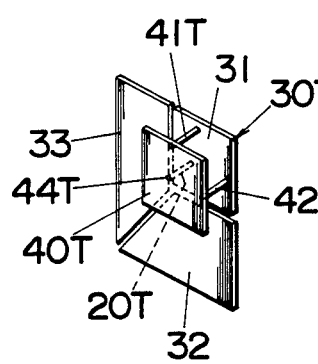
FIG. 30 is a perspective view showing a seventh embodiment of the present invention.
Figure 32A:
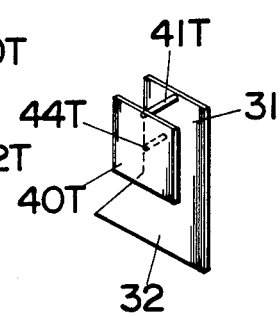
FIGS. 32A and 32B are respectively views illustrating the operations of the antenna of FIG. 30.
Figure 32B:
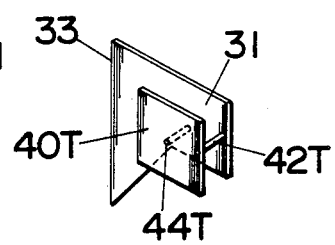

Referring to FIG. 30, a sixth embodiment of the present invention comprises a single radiating plate 40T and a ground plane 30T which is divided into first, second and third sections 31, 32 and 33. The first section 31, which is of rectangular configuration substantially identical to the radiating plate 40T, is shorted by individual shorting elements 41T and 42T at the middle of the adjacent sides thereof to the corresponding points to the first section 31. Although not shown in the figure, a number of electronic components are suitably mounted on one or more of the sections to form an associated electronic circuit of the antenna. The radiating plate 40T is coupled to such electronic circuit by means of a feed element 20T extending vertically from a feedpoint 44T at the center of the radiating plate 40T. The second and third sections 32 and 33 are arranged to extend from the first section 31 beyond the radiating plate 40T respectively in the directions perpendicular to one another, and connected to the first section 31 respectively by means of first and second switching elements S1 and S2, as shown in FIGS. 31 and 33. Each switching element S1, S2 is controlled, in response to a control signal fed to its input terminal 35, 36 to make the second and third sections 32 and 33 selectively conductive to the first sections 31, thus changing the radiation pattern of the antenna. That is, when the first switch element S1 is energized to electrically connect the first and second sections 31 and 32, while electrically isolating the third sections 33 from the first section 31, the ground plane 30T is practically elongated in the direction along which the first shorting element 41T and the feed element 44T are aligned, as shown in FIG. 32A, to modify the radiation pattern due to such elongation of the ground plane 30T in relation to the radiating plate 40T. In the like manner, the radiation pattern can be changed by connecting the third section 33 to the first section 31, as shown in FIG. 32B.

Additionally, the second and third sections 32 and 33 may be connected to the first section 31 respectively through high frequency choking coils [RFC] 34, as illustrated in FIG. 33. Each choking coil RFC serves to isolate the adjacent sections with regard to an operating radio frequency signal but connect the sections with a low frequency signal or direct current, thus allowing the conductor portion of these sections to be utilized as a common ground for the electronic circuit formed thereon, while maintaining selective connection to the adjacent sections with respect to the radio frequency.

<Seventh embodiment>

Figure 35:
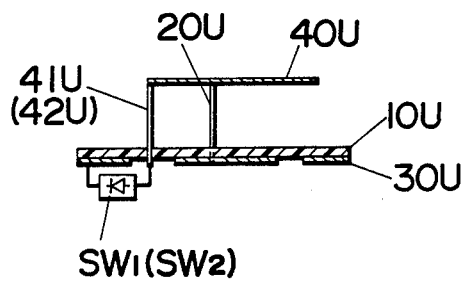
FIG. 35 is a sectional view of the antenna of FIG. 34.
Figure 34:
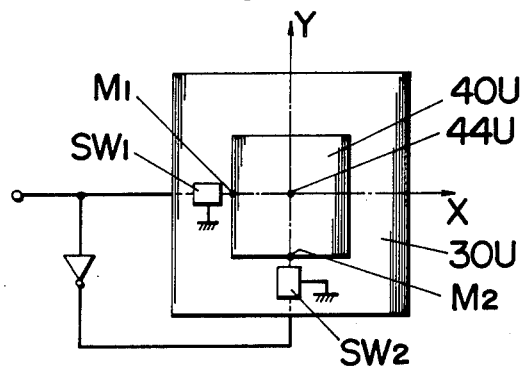
FIG. 34 is a schematic view showing an eighth embodiment of the present invention.

FIGS. 34 and 35 illustrate a seventh embodiment of the present invention which comprises a square shaped radiating plate 40U arranged parallel to a printed board 10U. The printed board is provided on its undersurface with a conductor layer defining a ground plane 30U parallel to the radiating plate 40U and a wiring pattern or patterns (not shown) for connection of electronic components (not shown) mounted on the printed board 10U to form the associated electronic antenna circuit. The radiating plate 40U is arranged over the center portion of the printed board 10U and is shorted at the middles M1 and M2 of the adjacent sides thereof to the ground plane 30U respectively by means of first and second shorting elements 41U and 42U with switching devices SW$_1$ and SW$_2$, while the radiating plate 40U has at its center a feedpoint 44U connected to a suitable point in the electronic circuit by a feed element 20U. Each of the switching devices SW$_1$ and S$_2$ is controlled in a time shearing manner to be alternately conductive and nonconductive at a high frequency rate, thus changing the radiation pattern substantially between two major patterns, one resulting from the alignment of the first shorting element 41U (M1) and the feedpoint 44U along the axis of X, and the other from the alignment of the second shorting element 42U (M2) and the feedpoint 44U, permitting the reduction of fading effects with a single radiating plate 40U. That is, single radiating plate can be utilized to provide two antennas of different radiating patterns or directivity, thereby contributing to the compact arrangement of the whole antenna structure, while assuring reduction of the fading effect.

What is claimed is:

1. An antenna and its electronic circuit combination comprising:
   a ground conductor plane;
   a radiating conductor plane disposed in parallel and spaced relation to said ground conductor plane to define therebetween an open air space and shorted at one end to said ground conductor plane, said radiating conductor plane is defined by a conductor plate with an access window;
   a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane wherein one or more of said electronic components can be accessed through said access window.

2. An antenna and its electronic circuit combination as set forth in claim 1, wherein
   said ground conductor plane has a width equal to that of said radiating conductor plane has a length greater than that of said radiating conductor plane and is shorted at a lengthwise end to a corresponding end of said radiating conductor plane to improve gain with respect to vertical polarization in a plane including a shorting connection perpendicular to ground and radiating planes.

3. An antenna and its electronic circuit combination as set forth in claim 1, wherein
   said radiating conductor plane is defined by a ring frame with a center opening, substantially all of said electronic components being disposed on said ground conductor plane at a portion corresponding to said center opening so as to be exposed therethrough.

4. An antenna and its electronic circuit combination as set forth in claim 3, wherein
   said radiating conductor plane forming ring frame is composed at least partially of a wire element.

5. An antenna and its electronic circuit combination as set forth in claim 1, wherein
   said radiating conductor plane is shorted at said one end to said ground conductor plane by means of a shorting element to leave the other end open with respect to said ground conductor plane, said ground conductor plane provided thereon with an I/O terminal for connection of said electronic circuit to an external device, said I/O terminal located at a portion adjacent to and opposite of said shorting element from the open end of said radiating conductor plane.

6. An antenna and its electronic circuit combination as set forth in claim 1, wherein
   said radiating conductor plane is coupled to said ground conductor plane by means of switchable reactance elements at differing points with respect to the shorting point between said radiating and ground conductor planes, said reactance elements being controlled to be selectively switched for electrical connection between said radiating and ground conductor planes.

7. An antenna and its electronic circuit combination as set forth in claim 1, wherein
   said ground conductor plane is divided into plural sections which are isolated with respect to a high frequency and first one of which is coupled to said radiating conductor plane by means of said shorting element and said feed element, said first one of said sections being arranged to be selectively coupled to the remaining ones of said sections with respect to such high frequency.

8. An antenna and its electronic circuit combination as set forth in claim 1, wherein
   said radiating conductor plane is connected to said ground conductor plane by means of more than one switchable shorting element, said switchable shorting elements being connected at differing points on said radiating conductor plane in relation to said feedpoint and controlled for selective shorting at different points between said radiating conductor plane and said ground conductor plane.

9. An antenna and its electronic circuit combination comprising:
- a ground conductor plane;
- a radiating conductor plane disposed in parallel and spaced relation to said ground conductor plane to define therebetween an open air space and shorted at one end to said ground conductor plane;
- a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane; and
- a printed board comprising a conductor layer on a substrate mounting said electronic components, said conductor layer being etched to provide a conductor loop extending around a periphery of the printed board to define said ground conductor plane and also etched to provide inside of said conductor loop, wiring pattern means for electrical interconnection of said electronic components.

10. An antenna and its electronic circuit combination comprising:
- a ground conductor plane;
- a radiating conductor plane disposed in parallel and spaced relation to said ground conductor plane to define therebetween an open air space and shorted at one end to said ground conductor plane;
- a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane; and
- a printed board with first and second conductor layers on opposite surfaces of a substrate, said first conductor layer confronting said radiating conductor plane and being etched to form a conductor loop which extends a periphery of said printed board to define said ground conductor plane while exposing said substrate inside of said conductor loop to define a mounting section for said electronic components, and said second conductor layer being etched to define thereat wiring pattern means for electrical interconnection of said electronic components.

11. An antenna and its electronic circuit combination comprising:
- a ground conductor plane;
- a radiating conductor plane disposed in parallel and spaced relation to said ground conductor plane to define therebetween an open air space and shorted at one end to said ground conductor plane;
- a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane; and
- a printed board with first and second conductor layers on a substrate, said first conductor layer being on an opposite side of said substrate away from said radiating plane to define thereat said ground conductor plane, and said second conductor layer being printed in the other surface of said substrate for connection with the electronic components mounted on said other surface of the substrate.

12. An antenna and its electronic circuit combination comprising:
- a ground conductor plane, said ground conductor plane is defined by a conductor plate with a mounting section of an electrically insulative material;
- a radiating conductor plane disposed in parallel and spaced relation to said ground conductor plane to define therebetween an open air space and shorted at one end to said ground conductor plane;
- a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane, said mounting section for mounting thereon said electronic components which form said electronic circuit, said electronic circuit being grounded to said conductor plate.

13. An antenna and its electronic circuit combination comprising:
- a ground conductor plane;
- a radiating conductor plane disposed in parallel and spaced relation to said ground conductor plane to define therebetween an open air space and shorted at one end to said ground conductor plane;
- a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane;
- a printed board comprising a conductor layer on a substrate mounting said electronic components, said conductor layer being etched to provide a conductor loop extending around a periphery of the printed board to define said ground conductor plane and also etched to provide inside of said conductor loop, wiring pattern means for electrical interconnection of said electronic components, and wherein
- said radiating conductor plane is defined by a conductor plate supported on said printed board to define therebetween said open air space for accommodating said electronic components, said conductor plate having a center opening through which said electronic components are exposed such that substantially no electronic components are located between a peripheral region of said radiating conductor plane forming said conductor plate and said ground conductor plane.

14. An antenna and its electronic circuit combination comprising:
- a ground conductor plane;
- a radiating conductor plane disposed in parallel and spaced relation to said ground conductor plane to define therebetween an open air space and shorted at one end to said ground conductor plane;

a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane;

said radiating conductor plane is defined by a conductor plate with a fixed shorting element for shorting to said ground conductor plane on which said feed element is disposed with one end in a contactable relation to said feedpoint on said conductor plate defining said radiating conductor plane, said conductor plate being movable relative to said ground conductor plane so as to vary a distance between the feedpoint on said radiating conductor plane and said shorting element for matching adjustment of antenna impedance to an impedance of said electric circuit.

15. An antenna and its electronic circuit combination as set forth in claim 14, wherein said feed element is provided in the form of a screw with a rounded tip for point contact with said radiation conductor plane, said feed element being threadedly supported on said ground conductor plane to make said rounded tip movable away and towards said radiating conductor plane.

16. An antenna and its electronic circuit combination as set forth in claim 14, wherein
said electronic circuit includes a level indicator for indicating the condition of the impedance matching between the antenna impedance and the electronic circuit impedance.

17. An antenna and its electronic circuit combination as set forth in claim 16, wherein
said level indicator is mounted on the ground conductor plane and is viewed through a window provided in said conductor plate defining said radiating conductor plane.

18. An antenna and its electronic circuit combination as set forth in claim 16, wherein said level indicator comprising a plurality of light emitting diodes which are controlled to turn on upon receiving different levels of a radio signal received by said electronic circuit through the antenna, said light emitting diodes being arranged such that a greater number of said diodes are turned on when the radio signal of higher level is received to be indicative of a higher matching efficiency between the antenna impedance and the circuit impedance.

19. An antenna and its electronic circuit combination comprising:
a ground conductor plane;
a radiating conductor plane disposed in parallel and spaced relation to said ground conductor plane to define therebetween an open air space and shorted at one end to said ground conductor plane;
a number of electronic components disposed on said ground conductor plane to form a receiving or transmitting electronic circuit which is electrically coupled by means of a feed element to a feedpoint on said radiating conductor plane, said electronic components being received within said open air space between said ground conductor plane and said radiating conductor plane;
said radiating conductor plane is defined by a ring frame extending in parallel relation to said ground conductor plane and having therein a center opening, said radiating conductor plane being shorted by a first short element to said ground conductor plane and cooperative therewith to constitute a receiving antenna, and further including another radiating plane shorted by a second short element common to said ground conductor plane to be cooperative therewith to constitute a transmitting antenna, said another radiating plane of said transmitting antenna being located within said center opening of said ring frame.

20. An antenna and its electronic circuit combination as set forth in claim 19, wherein
said another radiating plane is coupled to said ground conductor plane by means of a reactance element.

* * * * *